US008698305B1

United States Patent
Dewey et al.

(10) Patent No.: US 8,698,305 B1
(45) Date of Patent: *Apr. 15, 2014

(54) MULTI-CONFIGURATION GPU INTERFACE DEVICE

(75) Inventors: Thomas E. Dewey, Menlo Park, CA (US); James K. Dobbins, Santa Clara, CA (US); Joseph S. Minacapelli, Sunnyvale, CA (US); Simon A. Thomas, Campbell, CA (US)

(73) Assignee: Nvidia Corporation, Santa Clara, CA (US)

(*) Notice: Subject to any disclaimer, the term of this patent is extended or adjusted under 35 U.S.C. 154(b) by 1231 days.

This patent is subject to a terminal disclaimer.

(21) Appl. No.: 10/912,393

(22) Filed: Aug. 4, 2004

Related U.S. Application Data

(63) Continuation of application No. 10/197,071, filed on Jul. 16, 2002, now Pat. No. 6,797,998.

(51) Int. Cl.
*H01L 23/48* (2006.01)
*H05K 5/00* (2006.01)

(52) U.S. Cl.
USPC ............ 257/734; 257/693; 257/E23.171; 361/679.01; 361/679.02; 361/679.4; 361/748; 439/70; 439/71; 439/49; 439/189

(58) Field of Classification Search
USPC ........ 439/70, 71, 49, 189; 257/693, 734, 773, 257/E23.171; 361/679.01, 679.02, 679.4, 361/748
See application file for complete search history.

(56) References Cited

U.S. PATENT DOCUMENTS

| | | | |
|---|---|---|---|
| 3,381,276 A | 4/1968 | James | |
| 4,687,200 A | 8/1987 | Shirai | |
| 4,786,768 A | 11/1988 | Langewis et al. | |
| 5,874,906 A | 2/1999 | Willner et al. | |
| 5,918,023 A | 6/1999 | Olson et al. | |
| 5,982,635 A * | 11/1999 | Menzies et al. | 361/790 |
| 6,347,394 B1 | 2/2002 | Ochoa et al. | |
| 6,395,995 B1 * | 5/2002 | Joy et al. | 174/260 |
| 6,476,816 B1 | 11/2002 | Deming et al. | |
| 6,532,019 B1 | 3/2003 | Gulick et al. | |
| 6,563,299 B1 | 5/2003 | Van Horn et al. | |
| 6,567,880 B1 | 5/2003 | Olarig | |

(Continued)

FOREIGN PATENT DOCUMENTS

| | | |
|---|---|---|
| JP | 11-126126 | 11/1999 |
| JP | 2000-032110 | 1/2000 |

(Continued)

OTHER PUBLICATIONS

Tyborski, Michael A.; "Joysticks for the Commodore 64"; Compute! Issue 37/Jun. 1983/ 2 Pages.

*Primary Examiner* — Jasmine Clark

(57) ABSTRACT

A multi-configuration interface device for coupling different types of GPUs (graphics processor units) to a PCB (printed circuit board). The interface device comprises a GPU interface for a connection to the GPU and a PCB interface for a connection to the PCB. The GPU interface is implemented using a customizable attachment footprint for effectuating a connection to differing GPU types while maintaining the PCB interface for the connection to the PCB. The ball array for different GPUs can be configured to respectively support them. The interface device maintains a consistent PCB interface. Thus, as GPU characteristics change and evolve, or as different GPU versions are implemented, a consistent connection can be maintained for the PCB.

22 Claims, 3 Drawing Sheets

(56) References Cited

U.S. PATENT DOCUMENTS

| | | |
|---|---|---|
| 6,570,561 B1 | 5/2003 | Boesch et al. |
| 6,577,004 B1 | 6/2003 | Rumsey et al. |
| 6,778,390 B2 * | 8/2004 | Michael ......................... 361/695 |
| 6,785,287 B1 | 8/2004 | Honkala et al. |
| 6,789,030 B1 | 9/2004 | Coyle et al. |
| 6,797,998 B2 * | 9/2004 | Dewey et al. ................. 257/203 |
| 7,203,908 B1 | 4/2007 | Nakajima et al. |
| 2001/0027123 A1 | 10/2001 | Ishigaki |
| 2002/0142738 A1 | 10/2002 | Jambie et al. |
| 2003/0018397 A1 | 1/2003 | Chanu |
| 2003/0168738 A1 * | 9/2003 | Kabadi et al. ................. 257/738 |
| 2004/0031673 A1 | 2/2004 | Levy |
| 2005/0099394 A1 | 5/2005 | Chou et al. |
| 2005/0221867 A1 | 10/2005 | Zurek et al. |

FOREIGN PATENT DOCUMENTS

| | | |
|---|---|---|
| JP | 2003-029902 | 1/2003 |
| JP | 2003-223267 | 8/2003 |
| JP | 2003-338232 | 11/2003 |

* cited by examiner

MULTI-CONFIGURATION GPU INTERFACE DEVICE

FIELD OF THE INVENTION

The field of the present invention pertains to electronic integrated circuits. More particularly, the present invention relates to printed circuit board interfaces.

BACKGROUND OF THE INVENTION

Digital computer systems are being used today to perform a wide variety of tasks. Many different areas of business, industry, government, education, entertainment, and most recently, the home, are tapping into the enormous and rapidly growing list of applications developed for today's increasingly powerful computer devices.

Modern computer systems usually feature powerful digital processor integrated circuit devices. The processors are used to execute software instructions to implement complex functions, such as, for example, 3-D graphics applications, voice recognition, data visualization, and the like. The performance of many these applications is directly benefited by more powerful, more capable processors. With each new generation of processor, increasingly powerful computer systems are capable of more functions while decreasing in cost.

Computer system manufacturers often employ multiple configurations of processors, memory, and motherboards. The different configurations are used to satisfy the different requirements of varying market segments. For example, more powerful systems can include two or more processors and have provisions for a large amount of installed RAM. Similarly, more specialized computer systems can include specialized provisions for special function integrated circuit components, such as graphics accelerators, media processor chips, high-speed input output chips, and the like.

The central processing units (CPU) and the graphics processing units (GPU) of computer systems are fundamental to the power and capability of the overall computer system. As such, the design and the features of CPU and GPU integrated circuits evolved rapidly, as device manufacturers a spend large amounts of research and development effort improving their capabilities.

As computer systems increase in power, manufacturers also strive to reduce their overall cost. One method to control costs is to reduced the number of different types of supporting parts needed for each different type of CPU or GPU. For example, modern computer system chipsets are designed to support multiple models of a given processor generation or product line. In the past, a large number of chips (e.g., a dozen or more) populated a motherboard to support the CPU. More recently, many of the functions previously performed by separate chips are integrated into two or three chip components, thereby reducing manufacturing costs. Another example involves the preferred use of industry standard interfaces. For example, as the features and capabilities of CPUs evolve over time, the signals used to interface with external chipsets change.

New chip sets and interfaces must be designed to support the changed processors. This is a costly process (debugging, testing, etc.). Accordingly, major updates to the interfaces of a processor are generally limited to once every two to three years at least. For example, a socket interface of a processor line is usually not updated more often than once every two to three years, even though the internal architecture of the processor line may be updated several times within this time frame. Thus, there is pressure to limit changes to a processor's interface as successive models are introduced.

The pressure to limit changes to a processor's interface results in a number of problems. One such problem involves the fact that limiting changes in the processor interface can limit the evolution and improvement of processor models. New technology requiring a new interfaces are held back until it becomes cost effective to implement the new interface. For example, even though significant advances are made in a processor's internal architecture, clock speeds may increase significantly, or the like, changes to the processor's external socket interface are implemented only once every two to three years. Additionally, it is not cost effective to introduce different versions of a processor, since different versions, which may offer substantially customized features, may require new interfaces. New interfaces are costly to implement. Additionally, new interfaces have the undesirable effect of making previous interfaces obsolete (e.g., "Slot 1", "Socket 7", "Socket 8", etc. from Intel™ and the other CPU manufactures).

Thus what is required is an interface that can accommodate changes in the I/O architecture (electrical signal pins) of a processor. The present invention provides a novel solution to the above requirement.

SUMMARY OF THE INVENTION

Embodiments of the present invention provide a multi-configuration GPU interface having a standardized interface for coupling to a printed circuit board. Embodiments of the present invention provide an interface that can accommodate changes in the I/O architecture (electrical signal pins) of a GPU while maintaining a standardized interface for coupling to a printed circuit board. Additionally, embodiments of the present invention can accommodate different GPU versions supporting different feature sets while maintaining a standardized printed circuit board interface.

In one embodiment, the present invention is implemented as a multi-configuration interface device for coupling different types of GPUs to a PCB (printed circuit board). The interface device comprises a GPU interface for a connection to the GPU and a PCB interface for a connection to the PCB. The GPU interface is implemented using a customizable attachment footprint for effectuating a connection to differing GPU types while maintaining the PCB interface for the connection to the PCB. The customizable attachment footprint is configurable (e.g., as the interface device is manufactured) to support one of a number of different types of GPUs. The interface device maintains a consistent PCB interface across different customized attachment footprints. Thus, as GPU characteristics change and evolve, or as different GPU versions are implemented, a consistent connection can be maintained for the PCB.

Depending upon the requirements of a given GPU, embodiments of the interface device can be configured to support different types of attachment to the GPU, such as, for example, a wire bond attachment, a substrate attachment (wherein the substrate has a flip chip mounted GPU), and the like. Similarly, embodiments of the interface device include first and second areas of the customizable attachment footprint, wherein the second area is disposed around the periphery of the first area, and wherein the first area comprises a plurality of thermal balls or contact pads to support a wire bond attachment to a GPU.

In one embodiment, the GPU interface and the PCB the interface are configured to support an AGP 4× or AGP 8× interface. Similarly, the PCB interface can be configured to support dual DACs for dual displays and/or digital video output for digital displays.

In this manner, embodiments of the present invention implement a GPU interface device that provides a standardized interface for coupling to a printed circuit board and accommodates changes in the I/O architecture or feature set of a GPU while maintaining the standardized interface. Additionally, the interface device embodiments utilize customizable attachment footprints implemented with compact and inexpensive ball grid arrays to implement the GPU connection as opposed to prior art socket and slot interconnections.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention provide a multi-configuration GPU interface having a standardized interface for coupling to a PCB. Embodiments of the present invention provide an interface that can accommodate changes in the I/O architecture (electrical signal pins) of a GPU while maintaining a standardized interface for coupling to a PCB. Additionally, embodiments of the present invention can accommodate different GPU versions supporting different feature sets while maintaining a standardized PCB interface.

Figure 1:
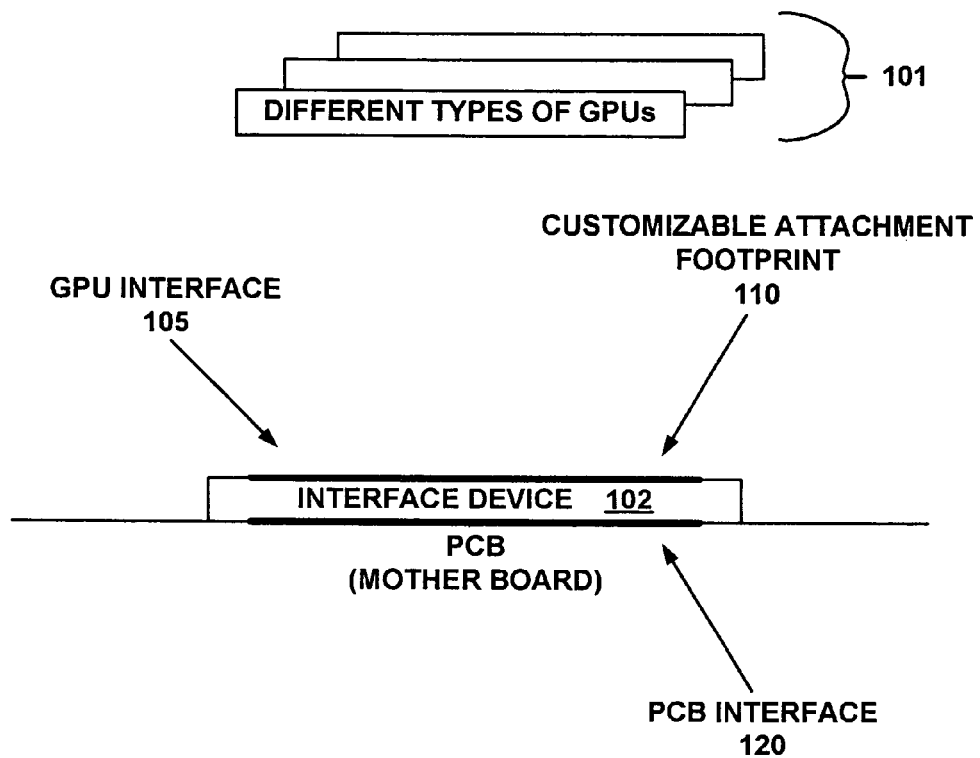
FIG. 1 shows a GPU interface system in accordance with one embodiment of the present invention.

FIG. 1 shows a GPU interface system 100 in accordance with one embodiment of the present invention. As depicted in FIG. 1, system 100 shows a plurality of different types of GPUs 101 using an interface device 102 to couple to a PCB 103.

In the system 100 embodiment, the interface device 102 functions as a multi-configuration interface device for coupling different types of GPUs to a PCB (printed circuit board).

The interface device 102 comprises a GPU interface 105 for a connection to the GPUs 101 and a PCB interface 120 for a connection to the PCB 103.

In this embodiment, the GPU interface 105 is implemented using a customizable attachment footprint 110 for effectuating a connection to differing GPU types 101 while maintaining the PCB interface 120 for the connection to the PCB 103. In accordance with the requirements of a GPU type, the customizable attachment footprint can include a solder ball array, an array of contact pads, or the like, arranged in a fashion to support the attachment of the GPU type. The attachment footprint 110 for different GPUs 101 can be configured (e.g., during manufacturing) to respectively support them (e.g., different ball counts, interface configurations, power-ground connections, contact pad geometry, and the like). The interface device 102 maintains a consistent PCB interface 120. Thus, as the characteristics of the different types of GPUs 101 change and evolve, or as different GPU versions 101 are implemented, a consistent connection can be maintained for the PCB via the PCB interface 120. Differing GPU types can be, for example, different types of graphics processor integrated circuits, identical graphics processor integrated circuits and differing amounts of memory, or the like.

Additionally, the interface device embodiments utilize compact and inexpensive attachment footprints (e.g., ball grid arrays, contact pads, etc.) to implement the GPU connection as opposed to prior art socket and slot interconnections. For example, ball grid arrays are more flexible than prior art slot connections or socket connections. For example, the customizable attachment footprint 110 of the present embodiment can accept a surface mounted GPU, substrate mounted GPU, and the like, as described below.

Figure 2:
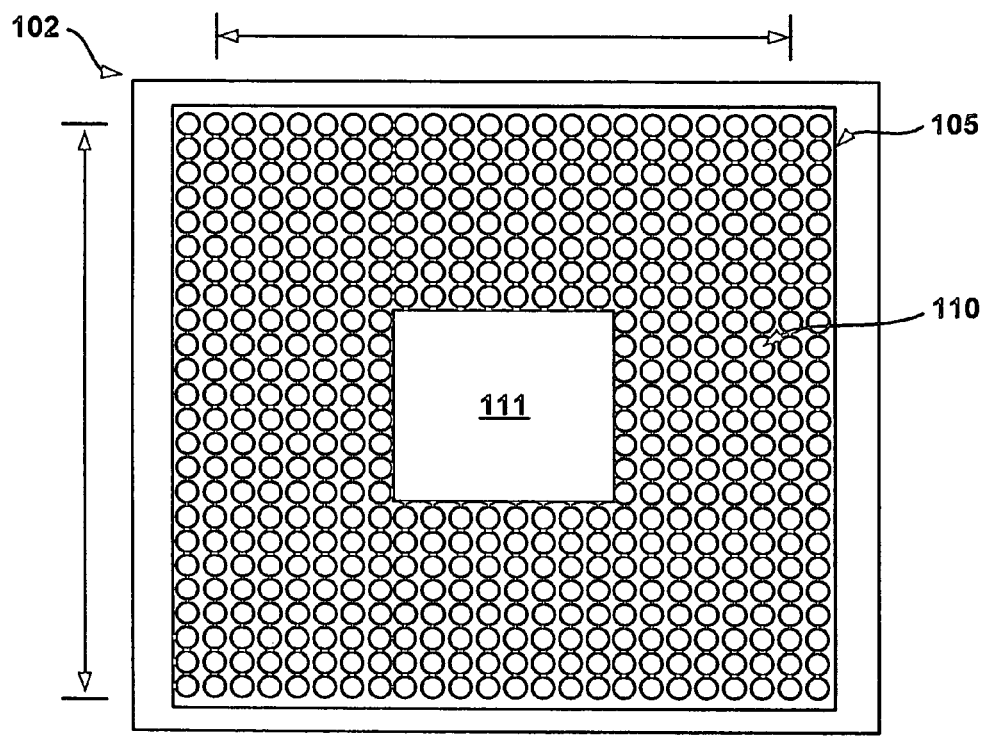
FIG. 2 shows a top-down view of the interface device in accordance with one embodiment of the present invention.

FIG. 2 shows a top-down view of the interface device 102 in accordance with one embodiment of the present invention. As depicted in FIG. 2, the interface device 102 includes the GPU interface 105 having the customizable attachment footprint 110 (e.g., not drawn to scale).

In accordance with differing requirements of different GPU types, the GPU interface 105 is configured to support different means of attachment for a given GPU type. For example, in one embodiment, the GPU interface 105 is configured to support a wire bond attachment to a GPU. In another embodiment, the GPU interface 105 is configured to support a substrate, wherein the substrate includes a mounted GPU in either a surface mounted configuration or a flip chip mounted configuration. In another embodiment, the GPU interface 105 can include a nonfunctional area 111 centrally disposed within the GPU interface 105 to implement either a solder attachment to a surface of a GPU (e.g., a flip chip mounted GPU on a substrate or on the device) or an adhesive attachment.

In a substrate mounted GPU embodiment, the customizable attachment footprint 110 of the GPU interface 105 can be configured to support a plurality of different RAM component configurations (e.g., one, two, four RAM components, etc.) mounted on the substrate in addition to the GPU (e.g., including an additional number of power and ground balls to support the RAM components, voltage reference balls for the RAM components, and the like).

Referring still to FIG. 2, in the present embodiment, the customizable attachment footprint 110 includes a first area located at the center of the customizable attachment footprint 110 (e.g., the balls immediately surrounding the nonfunctional area 111) and a second area disposed around the periphery of the centrally located first area. The balls of the first area include a plurality of thermal balls to support a wire bond attachment to a GPU. The customizable attachment footprint 110 includes a number of ground assignment balls in the signal ball rows (outer 7 rows of the array). The thermal balls in the center area (e.g., the balls immediately surrounding the nonfunctional area 111) are used for the wire-bond versions. Additionally, the ground to signal ratio among the balls of the customizable attachment footprint 110 is also relatively high, in comparison to prior art, thereby providing improved return paths for high speed signaling. The added number of peripheral ground balls provide a significant advantage to designs where the thermal ground balls in the center of the array (e.g., in the first area) provide both signal interconnections and function as the means of electrical grounding and return paths.

The customizable attachment footprint 110 supports separate power and ground balls for memory and core power. In one embodiment, these balls are primarily disposed in the corners of the customizable attachment footprint 110. In a case where the interface device 102 supports a substrate mounted GPU, this aspect permits the substrate to mount a number of memory components in addition to the GPU (e.g., two or more RAM memory components).

Embodiments of the customizable attachment footprint 110 have sufficient power, ground, and impedance calibration ball assignments to support different versions of the industry standard AGP (accelerated graphics port) interface. For example, the customizable attachment footprint 110 can be configured to support AGP 2×, AGP 4×, or AGP 8× compatible GPUs. Thus, for example, the interface device 102 can readily support a majority of the GPUs being manufactured to function with AGP 4×, and be easily configured to support AGP 8×, or greater, GPU designs when they arrive.

Embodiments of the customizable attachment footprint 110 support ball assignments for the different versions of AGP as described above. Additionally, the customizable attachment footprint 110 can be configured to support dual DACs (to support dual display monitors), digital-video-out (to support digital LCD displays, etc.), TMDS (temperature minimized differential signaling), LVDS (low voltage differential signaling), VIP (video interface port), memory interface (e.g., ROM), and general purpose IOs. Thus, each customizable attachment footprint 110 implementation can be configured to support a number of different subsets of this super-set of GPU interfaces. This allows designers to trade differing degrees of functionality with differing costs and price points.

Additionally, embodiments of the customizable attachment footprint 110 include balls assigned for external frame-buffer clock termination and frame-buffer VREF circuits. Each customizable attachment footprint 110 implementation can choose to connect to these external circuits or not.

Figure 3:
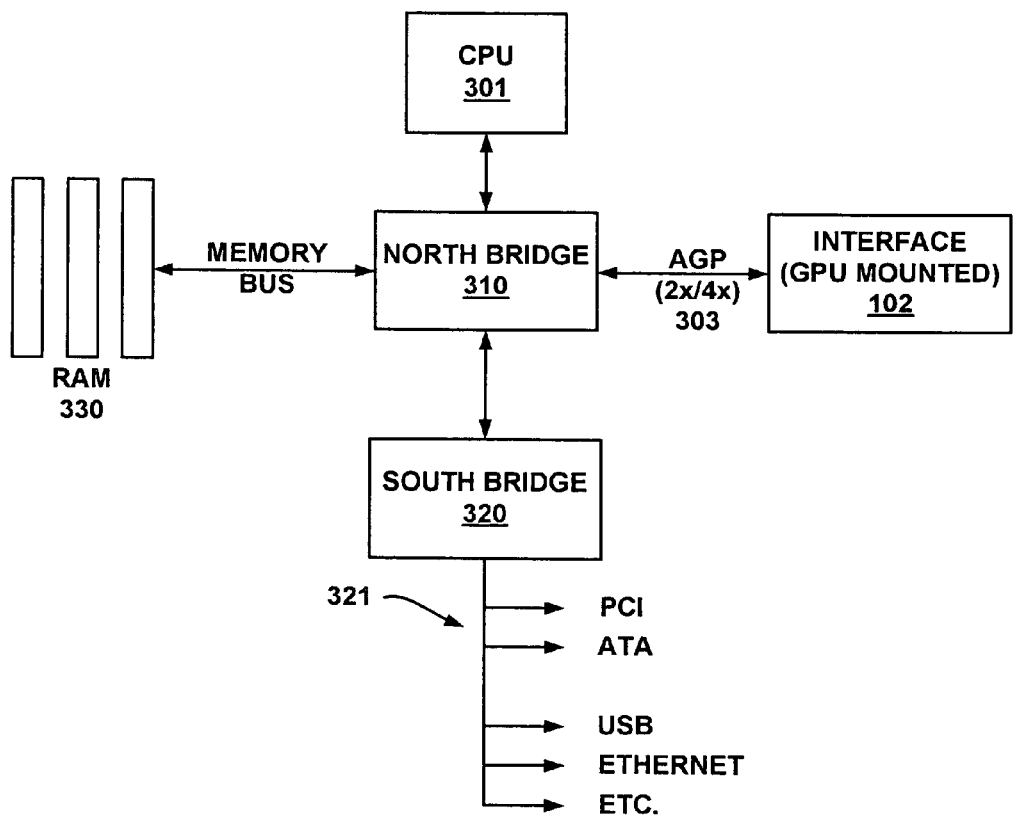
FIG. 3 shows a computer system diagram of the general components mounted on a PCB (printed circuit board) of a computer system in accordance with one embodiment of the present invention.

FIG. 3 shows a computer system diagram of the general components mounted on a PCB 300 of a computer system in accordance with one embodiment of the present invention. As depicted in FIG. 3, the PCB 300 includes the interface 102 in accordance with one embodiment of the present invention (having a GPU mounted thereon) coupled to a CPU 301, North bridge 310, and South bridge 320.

In this embodiment, the interface 102 implements an AGP interface (e.g., AGP 2×, 4×, 8×) for the mounted GPU. The interface 102 provides the communications pathway between the mounted GPU and the CPU 301 and memory 330 via the North bridge 310. Similarly, the interface 102 provides the communications pathway between the mounted GPU and devices coupled to the interfaces 321 (e.g., PCI, ATA, USB, Ethernet, etc.) via the North bridge 310 and South bridge 320.

Thus, the interface device 102 provides a multi-configuration GPU interface having a standardized interface for coupling to the PCB 300. The interface device 102 can thus accommodate changes in the I/O architecture (electrical signal pins) of a GPU while maintaining a standardized interface for coupling to the PCB 300.

It should be noted that, in accordance with different GPU requirements, differential signals can be assigned to adjacent balls of the interface device 102 for easy differential routing on the PCB 300. It should be noted that AGP balls are assigned to permit routing to an AGP connector of the PCB 300 in two layers.

Additionally, it should be noted that power/ground and "no-connect" balls can be strategically patterned to facilitate connection to 0402 de-coupling capacitors on an opposite side of the PCB 300 with minimum parasitic inductance (i.e. best possible de-coupling of high frequency noise). Similarly, the filtered power supplies and isolated ground balls of the interface device 102 are assigned to outer rows of the customizable attachment footprint 110 to permit easy connection to filter and de-coupling components (not shown) on the PCB 300. It should be noted that various voltage-rail ball assignments can be clustered together to facilitate a power-plane tiling on the PCB 300.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A multi-configuration interface device comprising:
an interface device for coupling a GPU (graphics processor units) to a PCB (printed circuit board), the interface device having a first interface connected to a GPU and a second interface that surface mounted to a PCB, the first interface comprising a customizable attachment footprint that implements a connection to differing GPU types while maintaining a consistent connection on said second interface.

2. The device of claim 1 further comprising the first interface supporting a wire bond attachment to a GPU.

3. The device of claim 1 further comprising the customizable attachment footprint is a surface mount attachment to a GPU.

4. The device of claim 1 further comprising the first interface supporting a substrate having a flip chip mounted GPU.

5. The device of claim 1 further comprising the customizable attachment footprint including a first area and a second area, the second area disposed around the periphery of the first area, the first area comprising a plurality of thermal balls to support a wire bond attachment to a GPU.

6. The device of claim 1 further comprising the customizable attachment footprint supporting an attachment to at least one memory component and a GPU.

7. The device of claim 1 further comprising the second interface as an AGP 4× interface.

8. The device of claim 1 further comprising the second interface as an AGP 8× interface.

9. The device of claim 1 further comprising the customizable attachment footprint of the first interface including a plurality of ground balls to support high-speed signaling of a GPU.

10. The device of claim 1 further comprising the second interface supporting at least two DACs for a plurality of displays.

11. The device of claim 1 further comprising the second interface supporting a digital video output for a digital display.

12. The device of claim 1 further comprising the customizable attachment footprint supporting differential signaling.

13. The device of claim 1 further comprising the second interface is free of a memory interface.

14. The device of claim 1 further comprising the second interface is free of an interface to volatile RAM.

15. The device of claim 1 further comprising the customizable attachment footprint is free of a memory interface.

16. The device of claim 1 further comprising the first interface implementing a connection to a plurality of different GPU types.

17. A multi-configuration interface device comprising:
an interface device for coupling a GPU (graphics processor unit) to a PCB (printed circuit board), the interface device having a GPU interface connected to a GPU and a PCB interface comprising a surface mount ball grid array connected to a PCB, the GPU interface having a customizable attachment footprint that implements a connection to different GPU types while maintaining said PCB interface unchanged.

18. The device of claim 17 further comprising the customizable attachment footprint supporting a substrate having a flip chip mounted GPU.

19. The device of claim 17 further comprising the device supporting a flip chip mounted GPU.

20. The device of claim 17 further comprising the device supporting temperature minimized differential signaling.

21. The device of claim 17 further comprising the GPU interface supporting external frame buffer clock termination circuits.

22. The device of claim 17 further comprising the GPU interface supporting frame buffer voltage reference circuits.

* * * * *